United States Patent
Endo et al.

(10) Patent No.: US 8,535,873 B2
(45) Date of Patent: Sep. 17, 2013

(54) PHOTOSENSITIVE RESIN COMPOSITION

(75) Inventors: Atsuo Endo, Tokyo (JP); Takao Ichikawa, Tokyo (JP); Yumi Tsujimura, Tokyo (JP)

(73) Assignee: Showa Denko K.K., Tokyo (JP)

( * ) Notice: Subject to any disclaimer, the term of this patent is extended or adjusted under 35 U.S.C. 154(b) by 256 days.

(21) Appl. No.: 13/203,304

(22) PCT Filed: Feb. 23, 2010

(86) PCT No.: PCT/JP2010/052747
§ 371 (c)(1),
(2), (4) Date: Aug. 25, 2011

(87) PCT Pub. No.: WO2010/098312
PCT Pub. Date: Sep. 2, 2010

(65) Prior Publication Data
US 2012/0015300 A1 Jan. 19, 2012

(30) Foreign Application Priority Data
Feb. 27, 2009 (JP) ................. 2009-046351

(51) Int. Cl.
C08K 5/22 (2006.01)
C08L 33/14 (2006.01)
(52) U.S. Cl.
USPC ................. 430/280.1; 430/281.1; 524/190; 524/509
(58) Field of Classification Search
None
See application file for complete search history.

(56) References Cited

U.S. PATENT DOCUMENTS

2005/0184402 A1* 8/2005 Senoo et al. ................. 257/783
2009/0087791 A1* 4/2009 Sakamoto ..................... 430/302

FOREIGN PATENT DOCUMENTS

| JP | 11-167204 | 6/1999 |
| JP | 11-255855 | 9/1999 |
| JP | 2004-219536 | 8/2004 |
| JP | 2004-271767 | 9/2004 |
| JP | 2005-221515 | 8/2005 |
| JP | 2006-308612 | 11/2006 |
| JP | 2007-033518 | 2/2007 |
| JP | 2007-33518 A * | 2/2007 |
| JP | 2008-165127 | 7/2008 |

OTHER PUBLICATIONS

International Search Report issued Mar. 30, 2010 in International (PCT) Application No. PCT/JP2010/052747.

* cited by examiner

Primary Examiner — Robert Sellers
(74) Attorney, Agent, or Firm — Wenderoth, Lind & Ponack, L.L.P.

(57) ABSTRACT

Disclosed is a photosensitive resin composition which has excellent transparency, heat resistance, thermal discoloration resistance, adhesion to a substrate and electrical characteristics, while exhibiting good developability and storage stability. Specifically disclosed is a photosensitive resin composition which contains the following components (A), (B) and (C). (A) a copolymer which contains (a1) hydroxyphenyl (meth)acrylate and (a2) an unsaturated epoxy compound as copolymerization components (B) a novolac resin which contains one or more phenols selected from among dimethylphenol, trimethylphenol, methylpropylphenol, dipropylphenol, butylphenol, methylbutylphenol, dibutylphenol, and 4,4'-dihydroxy-2,2'-diphenylpropane (C) a quinonediazide group-containing compound.

11 Claims, No Drawings

PHOTOSENSITIVE RESIN COMPOSITION

This application is a U.S. national stage of International Application No. PCT/JP2010/052747 filed Feb. 23, 2010.

TECHNICAL FIELD

The present invention relates to photosensitive resin compositions, more specifically it relates to photosensitive resin compositions well suited for use in forming protective films and planarization films of electronic parts such as liquid crystal display elements, integrated circuit elements, solid state image sensor, and the like and interlayer dielectric films, for forming microlenses or microlens arrays, light diffusive and reflective films of liquid crystal display elements, alignment control protrusions and spacers, color filters and optical waveguides.

BACKGROUND ART

Photosensitive resin compositions have been used for forming protective films to prevent electronic parts such as TFT type liquid crystal display elements, magnetic head elements, integrated circuit elements, solid state image sensor, and the like from being degraded or damaged and for forming interlayer dielectric films to insulate a space between layered wires. Among these uses, in particular, liquid crystal display elements are produced by a method comprising the steps of forming a transparent conductive circuit layer of ITO or the like on an interlayer dielectric film and further forming a liquid crystal alignment film on the same. The interlayer dielectric film is subjected to high temperature conditions during the step of forming a transparent electrode film and is exposed to a resist stripper liquid used in electrode pattern formation which it must be sufficiently resistant to. Consequently, it is required that photosensitive resin compositions used for forming interlayer dielectric films must have excellent developability and can be formed into films with excellent transparency, heat resistance, planarization properties, adhesion properties, chemical resistance and electrical characteristics.

In addition, microlenses having a lens diameter of about 3 to 100 μm or microlens arrays comprising regularly aligned microlenses are used as imaging optics of on-chip color filters of facsimile apparatuses, electronic copying machines, solid state image sensor, and the like or optical materials for optical fiber connectors. Among them, CCD elements used in digital cameras and the like have been further miniaturized recently as the number of pixels has been increased and the light-receiving area per CCD element has been reduced. Therefore, the formation of convex shape of microlenses on CCD elements has been studied as a means for increasing the quantity of received light. A method for forming microlenses used in CCD elements comprising exposing a photoresist film to light, developing the exposed film to form concave and convex patterns, heating the concave and convex patterns to a temperature higher than the glass-transition point to fluidize the same, and forming a hemispherical microlens by surface tension is known. Therefore, it is required that photosensitive resin compositions used in forming microlenses should have excellent developability and should also have transparency, melt flow properties, heat resistance as well as a high refractive index in order to impart light collecting properties.

Regarding liquid crystal displays, recently, there has been increased use of semi-transmissive and reflective liquid crystal displays, compared with conventional liquid crystal displays with backlight. A reflective plate such as an aluminum plate or the like is provided under a liquid crystal panel and light received from the upper portion of the panel is reflected onto the reflective plate to provide brightness. However, if the reflective plate is flat meaning that light obliquely incident on the panel surface is reflected in an oblique direction, and thus a sufficient axial brightness cannot be obtained. In order to solve this problem, a method comprising forming concave and convex patterns using a photosensitive resin as a base material for a reflective plate and forming a metal film on the same to prepare a light diffusive and reflective film has been examined. A high level of axial brightness can be achieved by this method, when obliquely incident light is used. Therefore, photosensitive resins used for forming light diffusive and reflective films should have concave and convex patterns, the heat resistance required for performing metal sputtering, solvent resistance, and the like.

Further, TN-type TFT-LCDs have been the most widely used liquid crystal displays. Levels of axial contrast and color reproducibility are the same or higher than those of cathode-ray tubes. However, they have the defect of a narrow viewing angle. In order to solve this problem, vertically aligned mode liquid crystal displays have been developed. Slits are provided in pixel areas of a display side electrode and pyramid-shape alignment control protrusions made of a photosensitive resin are formed on a light incident side electrode. As a liquid crystal adjacent to the alignment film can be kept standing vertically by this method, the viewing angle becomes wider and contrast is improved. In addition, a rubbing treatment step to align the liquid crystal is not necessary. Photosensitive resins used for forming alignment control protrusions should have an appropriate cross-sectional shape and are required to have a high degree of properties such as resistance to solvents including a solvent used in the subsequent alignment film formation step, heat resistance to heat applied during the step of forming alignment films, transparency, resolution, residual film ratios, and the like.

Further, bead-shaped spacers are used in liquid crystal displays in order to keep the distance between two transparent electrode substrates constant. The spacers are dispersed on either of the two transparent electrode substrates when they are bonded to each other and the cell gap changes depending on the diameter of the spacers. In order to avoid problems such as non-uniform cell gap and the like caused by a significantly varying diameters of the spacers, methods for forming spacers using photosensitive resins have been studied. It is required that the photosensitive resins used for forming spacers should have a high degree of properties such as transparency, resolution, residual film ratio, and the like as well as appropriate cross-sectional shapes.

There is a technical means using unsaturated carboxylic acids such as methacrylic acid and the like as components imparting alkali solubility in the above photosensitive resin compositions (Patent publications 1 to 5). However, it is difficult to manage the developability of these photosensitive resin compositions and there are also problems with their storage stability.

Patent publication 6 describes photosensitive resin compositions comprising copolymer (a) of hydroxystyrene and methyl methacrylate, thermally curable resin (b) reactive with copolymer (a), and photosensitizing agent (c). However, the photosensitive resin compositions described in the publication have a defect in that they are colored upon heating.

The inventors of the present application developed photosensitive resin compositions with excellent transparency, heat resistance, and the like in order to solve the technical problems regarding photosensitive resin compositions described in these patent publications (Patent publication 7).

PRIOR ART REFERENCES

Patent Publications

Patent publication 1: Japanese Patent Laid-Open No. 2003-330180
Patent publication 2: Japanese Patent Laid-Open No. 2005-107314
Patent publication 3: Japanese Patent Laid-Open No. 2004-170566
Patent publication 4: Japanese Patent Laid-Open No. 2003-76012
Patent publication 5: Japanese Patent Laid-Open No. 2005-49691
Patent publication 6: Japanese Patent Laid-Open No. 5-158232
Patent publication 7: Japanese Patent Laid-Open No. 2008-165127

SUMMARY OF THE INVENTION

Problems to be Solved by the Invention

However, photosensitive resin compositions having even more excellent properties are required as technology diversifies and advances.

Means for Solving the Problems

Novolac resins prepared by reacting a phenol with formaldehyde are occasionally used as components for photosensitive resin compositions. Properties of synthesized novolac resins are different depending on the kind of phenols used so that various novolac resins are used.

The inventors of the present application studied in order to develop photosensitive resin compositions having even more excellent properties than the photosensitive resin compositions described in the above patent publications, and as a result, they found that photosensitive resin compositions excellent in transparency, heat resistance, thermal discoloration resistance, adhesion to substrates, electrical characteristics, developability and storage stability can be provided by adding a specific novolac resin to a copolymer comprising hydroxyphenyl (meth)acrylate and an unsaturated epoxy compound as copolymerization components.

Specifically, the present invention relates (1) a photosensitive resin composition comprising copolymer [A] comprising hydroxyphenyl (meth)acrylate (a1) and unsaturated epoxy compound (a2) as copolymerization components, novolac resin [B] obtained by polycondensation of a phenol with formaldehyde, and quinonediazide group-containing compound [C], wherein the phenol is one or more phenols selected from dimethylphenol, trimethylphenol, methylpropylphenol, dipropylphenol, butylphenol, methylbutylphenol, dibutylphenol, or 4,4'-dihydroxy-2,2'-diphenylpropane, (2) the photosensitive resin composition according to (1), wherein copolymer [A] comprises 20 to 45 mol % of hydroxyphenyl (meth)acrylate (a1) and 45 to 80 mol % of unsaturated epoxy compound (a2), (3) the photosensitive resin composition according to (1) or (2), wherein novolac resin [B] is a novolac resin obtained by polycondensation of phenols comprising tert-butylphenol with formaldehyde, (4) the photosensitive resin composition according to any one of (1) to (3), wherein novolac resin [B] is a novolac resin having a carboxyl group, and (5) the photosensitive resin composition according to any one of (1) to (4), wherein the total of phenolic hydroxy groups and carboxyl groups of copolymer [A] and novolac resin [B] per 1.0 equivalent of epoxy groups of copolymer [A] is 0.8 to 1.1 equivalents.

EFFECTS OF THE INVENTION

The photosensitive resin compositions of the present application have excellent developability and storage stability. Coating films which have excellent transparency, heat resistance, thermal discoloration resistance, adhesion to substrates and electrical characteristics can be formed by using the same. The photosensitive resin compositions of the present application can be appropriately used for forming protective films and planarization films of electronic parts and interlayer dielectric films, for forming microlenses or microlens arrays, light diffusive and reflective films of liquid crystal display elements, alignment control protrusions, and spacers, color filters, optical waveguides and the like.

MODE FOR CARRYING OUT THE INVENTION

The photosensitive resin composition of the present invention will be described in detail below.

Copolymer [A] contained as an essential component in the photosensitive resin composition of the present invention is a copolymer comprising hydroxyphenyl (meth)acrylate (a1) and unsaturated epoxy compound (a2) as copolymerization components. Specific examples of (a1) include o-hydroxyphenyl acrylate, m-hydroxyphenyl acrylate, p-hydroxyphenyl acrylate, o-hydroxyphenyl methacrylate, m-hydroxyphenyl methacrylate, and p-hydroxyphenyl methacrylate. They can be used alone or in combination of two or more thereof.

Specific examples of (a2) include aliphatic epoxy group-containing unsaturated compounds and alicyclic epoxy group-containing unsaturated compounds. Specific examples of the aliphatic epoxy group-containing unsaturated compounds include glycidyl acrylate, glycidyl methacrylate, glycidyl α-ethyl acrylate, 3,4-epoxybutyl acrylate, 3,4-epoxybutyl methacrylate, 3,4-epoxybutyl α-ethyl acrylate, 6,7-epoxyheptyl acrylate, 6,7-epoxyheptyl methacrylate, 6,7-epoxyheptyl α-ethyl acrylate, vinyl glycidyl ether, allyl glycidyl ether, isopropenyl glycidyl ether, o-vinylbenzyl glycidyl ether, m-vinylbenzyl glycidyl ether, p-vinylbenzyl glycidyl ether, and the like.

The alicyclic epoxy group-containing unsaturated compounds include vinyl cyclohexene monoxide, 3,4-epoxycyclohexyl methyl acrylate, 3,4-epoxycyclohexyl methyl methacrylate, and the like. They can be used alone or in combination of two or more thereof. Among them, glycidyl methacrylate and 3,4-epoxycyclohexyl methyl methacrylate are preferable from the points of reactivity in copolymerization and transparency, heat resistance, and the like of the resulting coating films.

Copolymer [A] may be a copolymer consisting of (a1) and (a2) or may be a copolymer comprising other unsaturated compounds copolymerizable with (a1) and (a2) as copolymerization components. Specific examples of said other unsaturated compounds include t-butylcyclohexyl acrylate, triethylmethylcyclohexyl acrylate, tripropylmethylcyclohexyl acrylate, tributylmethylcyclohexyl acrylate, t-butylcyclohexyl methacrylate, triethylmethylcyclohexyl methacrylate, tripropylmethylcyclohexyl methacrylate, tributylmethylcyclohexyl methacrylate, hydroxystyrene, isopropenyl phenol, acrylic acid, methacrylic acid, crotonic acid, maleic acid, fumaric acid, citraconic acid, mesaconic acid, itaconic acid, maleic anhydride, fumaric anhydride, citraconic anhydride, mesaconic anhydride, itaconic anhydride, vinyl benzoate, o-carboxyphenyl (meth)acrylate, m-carboxyphenyl (meth) acrylate, p-carboxyphenyl (meth) acrylate, o-carboxyphenyl (meth) acrylamide, m-carboxyphenyl (meth) acrylamide, p-carboxyphenyl (meth)acrylamide, mono[2-(meth)acryloyloxyethyl] succinate, mono[2-(meth) acryloyloxyethyl] phthalate, ω-carboxypolycaprolactone mono(meth)acrylate, 5-carboxybicyclo[2.2.1]hept-2-ene, 5,6-dicarboxybicyclo[2.2.1]hept-2-ene, 5-carboxy-5-methylbicyclo[2.2.1]hept-2-ene, 5-carboxy-5-ethylbicyclo[2.2.1] hept-2-ene, 5-carboxy-6-methylbicyclo[2.2.1]hept-2-ene, 5-carboxy-6-ethylbicyclo[2.2.1]hept-2-ene, 5,6-dicarboxybicyclo[2.2.1]hept-2-ene anhydride, and other general alkyl esters of acrylic acid, alkyl esters of methacrylic acid, cyclic alkyl esters of acrylic acid, cyclic alkyl esters of methacrylic acid, aryl esters of acrylic acid, aryl esters of methacrylic acid, bicyclo unsaturated compounds, maleimide compounds, unsaturated aromatic compounds, other unsaturated compounds, and the like.

Developability is improved because copolymer [A] comprises (a1). The copolymerization ratio thereof is preferably 20 to 45 mol %, more preferably 30 to 40 mol % with respect to the total components. If (a1) accounts for less than 20 mol %, the compatibility of the composition may be reduced. However, even if the compatibility is good, insufficient alkali solubility may lead to poor development. If (a1) accounts for more than 45 mol %, electrical characteristics may be reduced.

In addition, processed coating films can be cured because copolymer [A] comprises (a2). The copolymerization ratio thereof is preferably 45 to 80 mol %, more preferably 45 to 70 mol % with respect to the total components. If (a2) accounts for less than 45 mol %, electrical characteristics are reduced. If it accounts for more than 80 mol %, the compatibility of the composition may be reduced. However, even if the compatibility is good, insufficient alkali solubility may lead to poor development.

Alkali solubility and electrical characteristics can be increased by using the specific novolac resin [B]. Novolac resins used in the present invention include novolac resins obtained by polycondensation of one or more phenols selected from dimethylphenol, trimethylphenol, methylpropylphenol, dipropylphenol, butylphenol, methylbutylphenol, dibutylphenol or 4,4'-dihydroxy-2,2'-diphenylpropane with formaldehyde.

Among these, if tert-butylphenol or 4,4'-dihydroxy-2,2'-diphenylpropane is used as the phenol, a particular improvement in the electrical characteristics can be obtained.

In addition, photosensitive resin compositions excellent in alkali solubility can be obtained by using a novolac resin having a carboxyl group as novolac resin [B]. Examples of the novolac resin having a carboxyl group include polycondensation products of the above phenols and benzoic acids with formaldehyde or products obtained by addition reaction of dibasic acid anhydrides such as succinic anhydride, tetrahydrophthalic anhydride, and the like to novolac resins. In particular, novolac resins obtained by addition reaction of succinic anhydride to polycondensation products of tert-butylphenol with formaldehyde exhibit excellent alkali solubility and electrical characteristics.

Regarding the mixture ratio of copolymer [A] with novolac resin [B], the total of phenolic hydroxyl groups of copolymer [A] and novolac resin [B] per 1.0 equivalent of epoxy groups of copolymer [A] is preferably 0.8 to 1.1 equivalents. If copolymer [A] and novolac resin [B] have carboxyl groups, the total of phenolic hydroxyl groups and carboxyl groups is preferably 0.8 to 1.1 equivalents. If the phenolic hydroxyl group equivalent or the total of phenolic hydroxyl group equivalent and carboxyl group equivalent does not fall within this range, compatibility, developability, and electrical characteristics of the composition may be reduced.

Quinonediazide group-containing compound [C] contained in the photosensitive resin composition of the present invention is an essential component as a photosensitizing agent. It may be any compounds so long as it can be used as a photosensitizing component. Preferable examples thereof include condensation products of phenolic compounds or alcohol compounds with 1,2-naphthoquinonediazide sulfonic acid halides. Specific examples thereof include 1,2-naphthoquinonediazide sulfonate of 2,3,4-trihydroxybenzophenone, 1,2-naphthoquinonediazide sulfonate of 2,4,6-trihydroxybenzophenone, 1,2-naphthoquinonediazide sulfonate of 2,2',4,4'-tetrahydroxybenzophenone, 1,2-naphthoquinonediazide sulfonate of 2,3,4,3'-tetrahydroxybenzophenone, 1,2-naphthoquinonediazide sulfonate of 2,3,4,4'-tetrahydroxybenzophenone, 1,2-naphthoquinonediazide sulfonate of 2,3,4,2'-tetrahydroxy-4'-methylbenzophenone, 1,2-naphthoquinonediazide sulfonate of 2,3,4,4'-tetrahydroxy-3'-methoxybenzophenone, 1,2-naphthoquinonediazide sulfonate of 2,3,4,2',6'-pentahydroxybenzophenone, 1,2-naphthoquinonediazide sulfonate of 2,4,6,3',4',5'-hexahydroxybenzophenone, 1,2-naphthoquinonediazide sulfonate of 3,4,5,3',4',5'-hexahydroxybenzophenone, 1,2-naphthoquinonediazide sulfonate of 2-methyl-2-(2,4-dihydroxyphenyl)-4-(4-hydroxyphenyl)-7-hydroxychromane, 1,2-naphthoquinonediazide sulfonate of 2-[bis{(5-isopropyl-4-hydroxy-2-methyl)phenyl}methyl]phenol, 1,2-naphthoquinonediazide sulfonate of 1-[1-(3-{1-(4-hydroxyphenyl)-1-methylethyl}-4,6-dihydroxyphenyl)-1-methylethyl]-3-(1-(3-{1-(4-hydroxyphenyl)-1-methylethyl}-4,6-dihydroxyphenyl)-1-methylethyl)benzene, 1,2-naphthoquinonediazide sulfonate of 4,6-bis{1-(4-hydroxyphenyl)-1-methylethyl}-1,3-dihydroxybenzenebis (2,4-dihydroxyphenyl)methane, 1,2-naphthoquinonediazide sulfonate of bis(p-hydroxyphenyl)methane, 1,2-naphthoquinonediazide sulfonate of tri (p-hydroxyphenyl)methane, 1,2-naphthoquinonediazide sulfonate of 1,1,1-tri (p-hydroxyphenyl)ethane, 1,2-naphthoquinonediazide sulfonate of bis (2,3,4-trihydroxyphenyl)methane, 1,2-naphthoquinonediazide sulfonate of 2,2-bis(2,3,4-trihydroxyphenyl)propane, 1,2-naphthoquinonediazide sulfonate of 1,1,3-tris(2,5-dimethyl-4-hydroxyphenyl)-3-phenylpropane, 1,2-naphthoquinonediazide sulfonate of 4,4'-[1-[4-[1-[4-hydroxyphenyl]-1-methylethyl]phenyl]ethyliden]bisphenol, 1,2-naphthoquinonediazide sulfonate of bis(2,5-dimethyl-4-hydroxyphenyl)-2-hydroxyphenylmethane, 1,2-naphthoquinonediazide sulfonate of 3,3,3',3'-tetramethyl-1,1'-spirobiinden-5,6,7,5',6',7'-hexanol, 1,2-naphthoquinonediazide sulfonate of 2,2,4-trimethyl-7,2',4'-trihydroxyflavan, and the like.

It is preferable that quinonediazide group-containing compound [C] is a compound prepared by condensing 1,2-naphthoquinonediazide sulfonic acid halide which preferably accounts for 30 to 85 mol %, more preferably 50 to 70 mol % with respect to hydroxyl groups of a phenolic compound or alcohol compound.

These photosensitizing agents [C] may be used alone or in combination of two or more thereof. The usage ratio thereof preferably ranges 5 to 60 parts by weight, more preferably 10 to 50 parts by weight with respect to 100 parts by weight of solid components of copolymer [A] and novolac resin [B]. If the ratio is less than 5 parts by weight, defective development occurs. If the ratio is more than 60 parts by weight, defective development occurs and transparency, insulating properties, and planarization of coating films are reduced, which are not preferable.

Copolymer [A] is obtained by polymerizing (a1), (a2), and other unsaturated group-containing compounds, if necessary. The polymerization method includes radical polymerization, cationic polymerization, anionic polymerization, coordinating anionic polymerization, and the like. More specifically, polymerization can be performed in a polymerization solvent comprising 10 to 60 wt % of (a1), (a2), and other unsaturated group-containing compounds using a polymerization initiator. The molecular weight can be adjusted by adjusting the solvent amount, the initiator amount, and the polymerization temperature. The polystyrene equivalent weight average molecular weight (according to the method described in examples) ranges from Mw: 1,500 to 50,000, preferably 2,000 to 30,000. If the molecular weight is less than 1,500, flat coating films cannot be obtained and this results in reduction of the residual film ratio after development, poor pattern shapes and the reduced heat resistance of obtained coating films and if it is more than 50,000, it results in reduced sensitivity, poor pattern shapes, and reduced storage stability, which are not preferable.

Chain transfer agents represented by mercaptans can be used in adjusting molecular weights.

Methanol, ethanol, 1-propanol, isopropyl alcohol, butanol, ethylene glycol, acetone, methyl ethyl ketone, methyl isobutyl ketone, tetrahydrofuran, dioxane, toluene, xylene, ethyl acetate, isopropyl acetate, n-propyl acetate, butyl acetate, ethylene glycol monomethyl ether acetate, propylene glycol monomethyl ether acetate, ethylene glycol monoethyl ether acetate, methoxybutyl acetate, ethylene glycol monobutyl ether acetate, diethylene glycol monoethyl ether acetate, diethylene glycol monobutyl ether acetate, propylene glycol monomethyl ether, ethylene glycol monoethyl ether, 3-methoxybutanol, diethylene glycol monoethyl ether, diethylene glycol monobutyl ether, dimethyl sulfoxide, dimethylformamide, dimethylacetamide, ethyl lactate and the like may be used as reaction solvents.

Novolac resin [B] is obtained by polycondensation reaction of one or more phenols selected from dimethylphenol, trimethylphenol, methylpropylphenol, dipropylphenol, butylphenol, methylbutylphenol, dibutylphenol, and 4,4'-dihydroxy-2,2'-diphenylpropane with formaldehyde in the presence of an acid catalyst, using an organic solvent, if necessary. In particular, if tert-butylphenol is used as the phenol, electrical characteristics are excellent. The molecular weight can be adjusted by adjusting the reaction molar ratio of the phenol to formaldehyde. The polystyrene equivalent weight average molecular weight (according to the method described in examples) ranges from Mw: 800 to 10,000, preferably 1,000 to 8,000. If the molecular weight is less than 800, flat coating films may not be obtained and it may result in reduction of the film retention after development or poor pattern shapes and reduced heat resistance of the obtained coating films and if it is more than 10,000, it may result in reduced sensitivity and poor pattern shapes, which are not preferable.

In addition, a method for introducing carboxyl groups into novolac resins is achieved by a method comprising conducting a polycondensation reaction of phenols with formaldehyde using hydroxybenzoic acid as one component of the phenols or by optionally dissolving the above-obtained novolac resin in a solvent and conducting an addition reaction of a dibasic acid anhydride such as succinic anhydride, tetrahydrophthalic anhydride, or the like to the novolac resin. It is preferable that the addition ratio of the acid anhydride to one mole of phenolic hydroxyl groups should be 0.3 to 0.5, from the points of alkali solubility and electrical characteristics.

The photosensitive resin compositions of the present invention comprise copolymer [A] above, specific novolac resin [B], and quinonediazide group-containing compound [C] as essential components, but may further comprise ultraviolet absorbers, sensitizers, sensitizing aids, plasticizers, thickening agents, organic solvents, dispersants, anti-foaming agents, surfactants, adhesion aids, thermosensitive acid-generating compounds, and compounds capable of being crosslinked with copolymer [A], novolac resin [B], and quinonediazide group-containing compound [C], if necessary.

The photosensitive resin composition of the present invention is prepared by uniformly mixing copolymer [A] above, specific novolac resin [B], and quinonediazide group-containing compound [C], and optionally added other components as described above and dissolving the mixture in an appropriate solvent to be used in solvent form.

Solvents which uniformly dissolve each component of copolymer [A] above, specific novolac resin [B], and quinonediazide group-containing compound [C], and optionally added other components but do not react with any components are used. Examples of the solvents include the same solvents exemplified as the solvents used in production of copolymer [A] above. Among them, the use of diethylene glycol ethyl methyl ether, diethylene glycol dimethyl ether, propylene glycol monomethyl ether, propylene glycol monomethyl ether acetate, methoxybuthyl acetate, methyl methoxypropionate, and ethyl ethoxypropionate is preferable from the points of the solubility of each component, reactivity with each component, ease in forming coating films, and the like. Further, high-boiling-point solvents such as N-methylpyrrolidone, γ-butyrolactone, N,N-dimethylacetamide, and the like can be used together with these solvents in order to increase the in-plane uniformity of the film thickness.

When preparing the photosensitive resin composition of the present invention in solution form, 600 parts by weight or less, preferably 500 parts by weight or less of the above solvents alone or in combination of two or more thereof can be added with respect to total 100 parts by weight of copolymer [A], novolac resin [B], and quinonediazide group-containing compound [C] and optionally added other components.

Next, a method for forming coating films using the photosensitive resin composition of the present invention will be explained below. First, the photosensitive resin composition of the present invention dissolved in an organic solvent is coated on a glass substrate, a silicon wafer, or other substrate comprising a surface of any kind of metal and is dried to form a coating film of the photosensitive resin composition. The method for coating the composition solution is not particularly limited, but includes suitable methods such as a spray method, a roll coating method, a spin-coating method, a bar coating method, a slit coating method, and the like. Drying conditions are different, depending on the kind of component, the ratio of the amounts of components used, and the like. For example, drying is performed at 60 to 110° C. for between approximately 30 seconds to 30 minutes.

Next, the formed coating film is irradiated with radiation via a mask having the predetermined pattern after which it is developed using a developer to perform patterning. Examples of radiation used in this process include g-ray (having a wavelength of 436 nm), i-ray (having a wavelength of 365 nm), a KrF excimer laser, an ArF excimer laser, X-ray, an electron beam, and the like. Light sources thereof include a low-pressure mercury lamp, a high-pressure mercury lamp, an extremely high-pressure mercury lamp, a chemical lamp, an excimer laser generating apparatus, and the like. Aqueous solutions of alkali compounds (basic compounds) such as sodium hydroxide, potassium hydroxide, sodium silicate, sodium metasilicate, ammonia, ethylamine, n-propylamine, diethylamine, diethylaminoethanol, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-undec-7-ene, 1,5-diazabicyclo[4.3.0]-non-5-ene, and the like may be used as the developer used in the development process. In addition, aqueous solutions prepared by adding appropriate amounts of a water-soluble organic solvent such as methanol, ethanol, or the like and a surfactant to the above aqueous alkaline solution or various organic solvents which dissolve the composition of the present invention may be used as the developer. Further, a suitable method such as paddle development, dip development, fluidized bed development, shower development, or the like may be used as the developing method. The development time varies, depending on the constitution of the composition, but can be set to be between 30 to 120 seconds, for example.

Next, a rinse treatment, for example, preferably with flowing water is performed on the patterned thin film. Further, the entire surface of the film is preferably irradiated with radiation to decompose any quinonediazide group-containing compound [C] remaining in the thin film. The remaining quinonediazide group-containing compound [C] causes light absorption. Transparency of the coating film improves after the subsequent light exposure step.

Next, a curing process is performed by a heat treatment on a hot plate, in an oven, or the like (a post-baking treatment). The firing temperature in this curing process is, for example, from 120 to 250° C. The heating time varies, depending on the type of heating apparatus. However, if the heat treatment is performed on a hot plate, it is 5 to 30 minutes. If the heat treatment is performed in an oven, it is 30 to 90 minutes. In particular, the step-baking method and the like in which the heating step is repeated more than once may be employed in forming microlenses and alignment control protrusions. More specifically, the pattern is fluidized by initial heating of a patterned resin layer at the temperature of glass transition or higher which is formed to have a hemispherical shape by surface tension, following heating at a higher enables crosslinking to proceed until a predetermined shape can be obtained.

As described above, patterned thin films that can be applied to various desired uses such as uses in protective films, planarization films, interlayer dielectric films, microlenses or microlens arrays, light diffusive and reflective films, alignment control protrusions, spacers, color filters, optical waveguides, and the like can be formed on the surface of substrates. The formed coating films are excellent in transparency, heat resistance, thermal discoloration resistance, adhesion to substrate, and electrical characteristics.

EXAMPLES

The present invention will be explained in more detail with reference to the Synthesis Examples and Examples below, but is not limited thereto. In addition, the average molecular weights of copolymer [A] and novolac resin [B] were determined by the method below.
(Determination of Average Molecular Weights)
The values of the weight average molecular weight (Mw) and the molecular weight distribution (Mw/Mn) of the obtained polymers were determined by gel permeation chromatography (GPC) under the following conditions and values in terms of polystyrene were obtained by calculation.
Column: Shodex KF-801+KF-802+KF-802+KF-803
Column temperature: 40° C.
Developing solvent: tetrahydrofuran
Detector: differential refractometer (Shodex RI-101)
Flow rate: 1 ml/min Synthesis Example of Copolymer [A]

Synthesis Example 1

45.5 parts by weight of p-hydroxyphenyl methacrylate, 54.5 parts by weight of glycidyl methacrylate, 400 parts by weight of propylene glycol monomethyl ether acetate, and 8.0 parts by weight of dimethyl-2,2'-azobis (2-methylpropionate) were charged into a flask equipped with a reflux condenser and a stirrer. After air in the flask was replaced with nitrogen, the liquid temperature was raised to 80° C. while stirring and a reaction was conducted at 80° C. for five hours. Absence of unreacted monomers was confirmed by gel permeation chromatography. Propylene glycol monomethyl ether acetate was distilled at 80° C. under reduced pressure for concentration. The solid content concentration was adjusted to 30 wt % to obtain a solution comprising copolymer [A-1].

The polystyrene equivalent weight average molecular weight (Mw) of copolymer [A-1] was 13,000 and the molecular weight distribution thereof (Mw/Mn) was 2.7.

Synthesis Example 2

18.1 parts by weight of p-hydroxyphenyl methacrylate, 81.9 parts by weight of glycidyl methacrylate, 400 parts by weight of propylene glycol monomethyl ether acetate, and 8.0 parts by weight of dimethyl-2, 2'-azobis (2-methylpropionate) were charged into a flask equipped with a reflux condenser and a stirrer. A reaction was conducted in the same manner as in Synthesis Example 1 to obtain a solution comprising copolymer [A-2].

The polystyrene equivalent weight average molecular weight (Mw) of copolymer [A-2] was 9,700 and the molecular weight distribution thereof (Mw/Mn) was 2.5.

Synthesis Example 3

49.4 parts by weight of p-hydroxyphenyl methacrylate, 43.8 parts by weight of glycidyl methacrylate, 6.8 parts by weight of tricyclodecanyl methacrylate, 400 parts by weight of propylene glycol monomethyl ether acetate, and 8.5 parts by weight of dimethyl-2,2'-azobis(2-methylpropionate) were charged into a flask equipped with a reflux condenser and a stirrer. A reaction was conducted in the same manner as in Synthesis Example 1 to obtain a solution comprising copolymer [A-3].

The polystyrene equivalent weight average molecular weight (Mw) of copolymer [A-3] was 10,200 and the molecular weight distribution thereof (Mw/Mn) was 2.6.

Synthesis Example 4

38.3 parts by weight of p-hydroxyphenyl methacrylate, 48.0 parts by weight of glycidyl methacrylate, 13.8 parts by weight of tert-butylcyclohexyl methacrylate, 400 parts by weight of propylene glycol monomethyl ether acetate, and 8.5 parts by weight of dimethyl-2,2'-azobis(2-methylpropionate) were charged into a flask equipped with a reflux condenser and a stirrer. A reaction was conducted in the same manner as in Synthesis Example 1 to obtain a solution comprising copolymer [A-4].

The polystyrene equivalent weight average molecular weight (Mw) of copolymer [A-4] was 9,600 and the molecular weight distribution thereof (Mw/Mn) was 2.5.

Comparative Synthesis Example 1

25.5 parts by weight of methacrylic acid, 52.5 parts by weight of glycidyl methacrylate, 22.0 parts by weight of styrene, 400 parts by weight of propylene glycol monomethyl ether acetate, and 12.0 parts by weight of dimethyl-2,2'-azobis (2-methylpropionate) were charged into a flask equipped with a reflux condenser and a stirrer. A reaction was conducted in the same manner as in Synthesis example 1 to obtain a solution comprising copolymer [A-5].

The polystyrene equivalent weight average molecular weight (Mw) of copolymer [A-5] was 10,000 and the molecular weight distribution thereof (Mw/Mn) was 2.6.

Synthesis Example 5

100 parts by weight of p-tert-butylphenol, 41.0 parts by weight of 37% aqueous formaldehyde solution, and 0.5 part by weight of oxalic acid were charged in a flask equipped with a reflux condenser and a stirrer. The liquid temperature was raised to a reflux temperature while stirring, a reaction was conducted at the reflux temperature for five hours, and then water and unreacted p-tert-butylphenol were removed by heating under reduced pressure to obtain novolac resin [B-1].

The polystyrene equivalent weight average molecular weight (Mw) of novolac resin [B-1] was 1,260 and the molecular weight distribution thereof (Mw/Mn) was 1.7.

Synthesis Example 6

100 parts by weight of the novolac resin obtained in Synthesis example 5 and 25 parts by weight of propylene glycol monomethyl ether acetate were charged in a flask equipped with a reflux condenser and a stirrer and were dissolved by heating while stirring. Subsequently, 31.25 parts by weight of succinic anhydride was charged and was reacted at 140° C. for three hours. Absence of infrared ray absorption by the carbonyl group of the acid anhydride at 1,789 cm$^{-1}$ was confirmed. Propylene glycol monomethyl ether acetate of a solvent was removed by heating under reduced pressure to obtain novolac resin [B-2] having a carboxyl group.

The polystyrene equivalent weight average molecular weight (Mw) of novolac resin [B-2] was 1,390 and the molecular weight distribution thereof (Mw/Mn) was 1.8.

Comparative Synthesis Example 2

100 parts by weight of o-cresol, 62.8 parts by weight of 37% formalin, and 1.8 parts by weight of oxalic acid were charged in a flask equipped with a reflux condenser and a stirrer. The liquid temperature was raised to the reflux temperature while stirring and a reaction was conducted at the reflux temperature for five hours. Subsequently, water and unreacted o-cresol were removed by heating under reduced pressure to obtain novolac resin [B-3].

The polystyrene equivalent weight average molecular weight (Mw) of novolac resin [B-3] was 1,000 and the molecular weight distribution thereof (Mw/Mn) was 1.7.

Synthesis Example 7

100 parts by weight of 1-[1-(4-hydroxyphenyl) isopropyl]-4-[1,1-bis (4-hydroxyphenyl) ethyl]benzene, 153.6 parts by weight of 1,2-naphthoquinonediazide-5-sulfonylchloride, and 1240 parts by weight of tetrahydrofuran were charged in a flask equipped with a reflux condenser and a stirrer and were dissolved by stirring. A mixture solution of 63.6 parts by weight of triethylamine and 63.6 parts by weight of tetrahydrofuran was dropped over one hour at room temperature and then reacted for one hour. After 11.9 parts by weight of 35% hydrochloric acid was dropped and triethylamine hydrochloride was filtered, the filtrate was poured to 6500 parts by weight of 0.1% aqueous hydrochloric acid. The formed precipitate was filtered, was washed with water, and was dried to obtain 1,2-naphthoquinonediazide-5-sulfonate of 1-[1-(4-hydroxyphenyl)isopropyl]-4-[1,1-bis(4-hydroxyphenyl) ethyl]benzene, i.e., quinonediazide group-containing compound [C-1].

Example 1

[Preparation of Photosensitive Resin Compositions]

100 parts by weight of the solid content of copolymer [A-1] obtained in Synthesis Example 1, 20.5 parts by weight of novolac resin [B-1], and 24.1 parts by weight of 1,2-naphthoquinonediazide-5-sulfonate of 1-[1-(4-hydroxyphenyl)isopropyl]-4-[1,1-bis(4-hydroxyphenyl) ethyl]benzene were mixed and were dissolved in propylene glycol monomethyl ether acetate such that the total solid component concentration was 20%. The solution was subjected to filtration with 0.2 µm membrane filter to prepare solution (S-1) of a photosensitive resin composition.

Examples 2 to 8 and Comparative Examples 1 to 4

[Preparation of Photosensitive Resin Compositions]

Regarding copolymers [A-1] to [A-5] obtained in Synthesis Examples 1 to 4 and Comparative Synthesis example 1 and novolac resins [B-1] to [B-3] obtained in Synthesis Examples 5 and 6 and Comparative Synthesis Example 2, Solutions (S-2) to (S-12) of photosensitive resin compositions having the constitutions shown in Table 1 were prepared.

[Storage Stability]

The viscosities of Solutions (S-1) to (S-12) of the photosensitive resin compositions that had been stored for one month at room temperature were determined. In comparison with the viscosities determined immediately after the preparation of the solutions, those having a viscosity increase rate after the storage for one month at room temperature of less than 10% were evaluated as o and those having an increase rate of 10% or higher were evaluated as x.

[Coating Properties]

Solutions (S-1) to (S-12) of the photosensitive resin compositions were coated on glass substrates such that the film thickness was 3 µm and were dried in an oven at 80° C. for 30 minutes. The coating film of each solution was transparent and had a uniform thickness. The coating properties thereof were excellent.

[Developability]

The dried coating films were exposed to light by an extremely high-pressure mercury lamp via a positive pattern mask, were immersed in a 2.38% aqueous tetramethylammonium hydroxide solution for one minute to conduct processing, and were washed with pure water. Those with a transferred positive pattern and excellent developability were evaluated as ⊚. Those which had a transferred positive pattern, but had some development residues in a part were evaluated as o. Those which had a transferred positive pattern, but had large development residues were evaluated as Δ. Those which did not have a transferred positive pattern and had peelings in a part of residual film portions were evaluated as x.

[Adhesion Properties]

Formed positive patterns of the processed coating films were observed by a microscope. (S-1) to (S-8) were excellent without defective patterns and the like observed. Peeling was observed in a part of the residual film portions of the coating film of (S-9).

[Transparency]

The entire surface of the dried coating films were exposed to light without a positive pattern mask and the dried coating films were heated and cured in an oven at 200° C. for 30 minutes. The minimum transmittances at a wavelength of 400 to 800 nm of obtained substrates with the cured coating films were determined by a spectral photometer. A glass substrate was used to obtain a blank value. The higher the transmittance, the better.

[Electrical Characteristics]

Solutions (S-1) to (S-12) of the photosensitive resin compositions were coated on metal substrates such that the film thickness was 3 μm and were dried in an oven at 80° C. for 30 minutes. The entire surfaces of the dried coating films were exposed to light without a positive pattern mask and the coating films were heated and cured in an oven at 200° C. for 30 minutes. The dielectric constants of the obtained cured coating films at 1 MHz were determined. The practical level of the dielectric constant is at least 4.5 or less. The lower the dielectric constant, the better.

[Heat Resistance]

After curing by heat at 200° C. for 30 minutes, a reheating process at 230° C. for two hours was performed and the film thickness was determined. The film thickness change after reheating, i.e., a film thickness reduction rate with respect to the film thickness obtained after curing by heat at 200° C. for 30 minutes was calculated. Coating films having a film thickness reduction rate after heating at 230° C. for two hours of less than 3% were evaluated as o. Those having a reduction rate of 3% or more and less than 5% were evaluated as Δ. Those having a reduction rate of 5% or more were evaluated as x.

[Thermal Discoloration Resistance]

The minimum transmittances at a wavelength of 400 to 800 nm of obtained substrates with the films that were cured by heat at 200° C. for 30 minutes, and then were subjected to a reheating process at 230° C. for 30 minutes were determined. A glass substrate was used to obtain a blank value. The thermal discoloration resistance was determined, in terms of the rate of change in transmittance of the films that had been subjected to the reheating process in comparison with the films that had been subjected to curing by heat at 200° C. for 30 minutes. Coating films having the rate of change of less than 3% after heating at 230° C. for two hours were evaluated as o. Those having a rate of change of 3% or higher and less than 5% were evaluated as Δ. Those having a rate of change of 5% or higher were evaluated as x.

The results described above are shown in the Table.

| | Example 1 | Example 2 | Example 3 | Example 4 | Example 5 | Example 6 | Example 7 | Example 8 | Comp. Example 1 | Comp. Example 2 | Comp. Example 3 | Comp. Example 4 |
|---|---|---|---|---|---|---|---|---|---|---|---|---|
| Photosensitive resin composition | S-1 | S-2 | S-3 | S-4 | S-5 | S-6 | S-7 | S-8 | S-9 | S-10 | S-11 | S-12 |
| Copolymer [A] | | | | | | | | | | | | |
| A-1 | 100.0 | 100.0 | | | | | | | | | | 100.0 |
| A-2 | | | | | | | | | | | 100.0 | |
| A-3 | | | 100.0 | 100.0 | | | | | | | | |
| A-4 | | | | | 100.0 | 100.0 | 100.0 | 100.0 | | 100.0 | | |
| A-5 | | | | | | | | | 100.0 | | | |
| Novolac resin [B] | | | | | | | | | | | | |
| B-1 | 20.5 | | 4.9 | | | | | | | | | |
| B-2 | | 26.9 | | 6.5 | 4.6 | 15.5 | 25.8 | 39.7 | | | | |
| B-3 | | | | | | | | | | | 56.1 | 15.1 |
| Quinonediazide group-containing compound [C] | | | | | | | | | | | | |
| C-1 | 24.1 | 25.4 | 21.0 | 21.3 | 20.9 | 23.1 | 25.2 | 27.9 | 20.0 | 20.0 | 31.2 | 23.0 |
| Storage stability | ○ | ○ | ○ | ○ | ○ | ○ | ○ | ○ | X | ○ | ○ | ○ |
| Coating properties | ○ | ○ | ○ | ○ | ○ | ○ | ○ | ○ | ○ | ○ | ○ | ○ |
| Developability | ○ | ⊙ | ○ | ⊙ | Δ | ⊙ | ⊙ | ⊙ | X | Δ | Δ | ⊙ |
| Adhesion properties | ○ | ○ | ○ | ○ | ○ | ○ | ○ | ○ | X | ○ | ○ | ○ |
| Transparency | 98 | 98 | 98 | 99 | 99 | 99 | 99 | 98 | 98 | 99 | 95 | 96 |
| Electrical characteristics | 4.2 | 4.0 | 3.9 | 3.8 | 3.7 | 3.5 | 3.4 | 3.8 | 3.8 | 4.4 | 4.5 | 4.3 |
| Heat resistance | ○ | ○ | ○ | ○ | ○ | ○ | ○ | ○ | X | ○ | Δ | ○ |
| Thermal yellowish discoloration resistance | ○ | ○ | ○ | ○ | ○ | ○ | ○ | ○ | Δ | X | ○ | Δ | Δ |

Industrial Applicability

The photosensitive resin composition of the present invention has excellent transparency, heat resistance, thermal discoloration resistance, adhesion to substrates, and electrical characteristics. It is well suited for use in forming protective films and planarization films of electronic parts and interlayer dielectric films, for forming microlenses or microlens arrays, light diffusive and reflective films of liquid crystal display elements, alignment control protrusions and spacers, color filters and optical waveguides, and the like.

The invention claimed is:

1. A photosensitive resin composition comprising copolymer [A] comprising hydroxyphenyl (meth)acrylate (a1) and unsaturated epoxy compound (a2) as copolymerization components, novolac resin [B] obtained by polycondensation of a phenol with formaldehyde, and quinonediazide group-containing compound [C], wherein the phenol is one or more phenols selected from dimethylphenol, trimethylphenol, methylpropylphenol, dipropylphenol, butylphenol, methylbutylphenol, dibutylphenol, or 4,4'-dihydroxy-2,2'-diphenylpropane.

2. The photosensitive resin composition according to claim 1, wherein copolymer [A] comprises 20 to 45 mol % of hydroxyphenyl (meth)acrylate (a1) and 45 to 80 mol % of unsaturated epoxy compound (a2).

3. The photosensitive resin composition according to claim 1, wherein novolac resin [B] is a novolac resin obtained by polycondensation of phenols comprising tert-butylphenol with formaldehyde.

4. The photosensitive resin composition according to claim 1, wherein novolac resin [B] is a novolac resin having a carboxyl group.

5. The photosensitive resin composition according to claim 4, wherein the total of phenolic hydroxy groups and carboxyl groups of copolymer [A] and novolac resin [B] per 1.0 equivalent of epoxy groups of copolymer [A] is 0.8 to 1.1 equivalents.

6. The photosensitive resin composition according to claim 2, wherein novolac resin [B] is a novolac resin obtained by polycondensation of phenols comprising tert-butylphenol with formaldehyde.

7. The photosensitive resin composition according to claim 2, wherein novolac resin [B] is a novolac resin having a carboxyl group.

8. The photosensitive resin composition according to claim 3, wherein novolac resin [B] is a novolac resin having a carboxyl group.

9. The photosensitive resin composition according to claim 7, wherein the total of phenolic hydroxy groups and carboxyl groups of copolymer [A] and novolac resin [B] per 1.0 equivalent of epoxy groups of copolymer [A] is 0.8 to 1.1 equivalents.

10. The photosensitive resin composition according to claim 8, wherein the total of phenolic hydroxy groups and carboxyl groups of copolymer [A] and novolac resin [B] per 1.0 equivalent of epoxy groups of copolymer [A] is 0.8 to 1.1 equivalents.

11. The photosensitive resin composition according to claim 4, wherein the total of phenolic hydroxy groups and carboxyl groups of copolymer [A] and novolac resin [B] per 1.0 equivalent of epoxy groups of copolymer [A] is 0.8 to 1.1 equivalents.

* * * * *